(12) United States Patent
Chondroudis et al.

(10) Patent No.: US 6,420,056 B1
(45) Date of Patent: Jul. 16, 2002

(54) ELECTROLUMINESCENT DEVICE WITH DYE-CONTAINING ORGANIC-INORGANIC HYBRID MATERIALS AS AN EMITTING LAYER

(75) Inventors: Konstantinos Chondroudis, North White Plains; David Brian Mitzi, Westchester, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/349,345

(22) Filed: Jul. 8, 1999

(51) Int. Cl.$^7$ ................................ H05B 33/14
(52) U.S. Cl. ................... 428/690; 313/502; 313/506
(58) Field of Search .................... 428/690, 917; 313/502–509

(56) References Cited

U.S. PATENT DOCUMENTS

| | | | |
|---|---|---|---|
| 5,783,292 A | 7/1998 | Tokito et al. ............... 428/212 |
| 5,871,579 A | 2/1999 | Liang et al. .................. 117/68 |
| 5,882,548 A | * 3/1999 | Liang et al. ............ 252/301.16 |
| 6,150,536 A | * 11/2000 | Chondroudis et al. ......... 549/2 |

OTHER PUBLICATIONS

Appl. Phys. Lett. 65 (6), Aug. 8, 1994, pp. 676–677, M. Era et al., "Organic–Inorganic Heterostructure Electroluminescent Device Using a Layered Perovskite Semiconductor $(C_6H_5C_2H_4NH_3)_2PbI4_2$".

Merriam–Webster's Collegiate Dictionary, 1998, Merriam-–Webster, Inc., Tenth Edition, p. 567.*

* cited by examiner

Primary Examiner—Cynthia H. Kelly
Assistant Examiner—Dawn Garrett
(74) Attorney, Agent, or Firm—Ohlandt, Greeley, Ruggiero & Perlr, L.L.P.; Daniel P. Morris

(57) ABSTRACT

The present invention relates to an electroluminescent device comprising an anode, a cathode and an emitting layer. The emitting layer comprises a self-assembling organic-inorganic hybrid material containing an organic component and an inorganic component. The organic component comprises a dye that fluoresces in the visible range. In addition, an optically inert component may replace a portion of the organic dye component to increase fluorescence.

17 Claims, 6 Drawing Sheets

US 6,420,056 B1

ELECTROLUMINESCENT DEVICE WITH DYE-CONTAINING ORGANIC-INORGANIC HYBRID MATERIALS AS AN EMITTING LAYER

This invention was made with Government support under DAAL01-96-C-0095 awarded by the Army Research Laboratory. The Government has certain rights in this invention.

FIELD OF THE INVENTION

This invention relates to the field of organic light emitting diodes. More particularly, it relates to electroluminescent devices which contain fluorescent organic-inorganic hybrid materials.

BACKGROUND OF THE INVENTION

There is much interest in the field of organic light emitting diodes (OLED's) as electroluminescent devices for flat panel displays. The requirements that must be met before OLED's can be used in flat panel displays are: (1) high brightness (100 cd/m$^2$ for indoor use), (2) satisfactory color saturation, (3) high efficiency (which relates to low operating voltage (less than about 15V) and current, and (4) long lifetime (greater than about 50,000 hours).

Many of these requirements cannot be met because of the poor electrical transport properties of most electroluminescent organic materials. For example, charge conduction for these materials requires electrical fields in the range of 3–5 MV/cm. These high electric fields increase power requirements and reduce the lifetime of the device (e.g., through electromigration). In addition, difficulty in balancing the transport of electrons and holes through the device, often results in reduced efficiency.

Recent progress in flat panel displays has led to the development of organic-inorganic films for electroluminescent devices. In these devices, a thin film of an organic-inorganic compound emits visible light when current is supplied to the film. The illumination occurs at a characteristic wavelength of the organic compound when there is a transition from an excited state to the ground state.

U.S. Pat. No. 5,783,292 to Tokito et al. (Tokito) discloses an organic-inorganic electroluminescent device that contains a mixture of inorganic and organic compounds. The organic-inorganic mixtures are deposited on a substrate by vacuum deposition to form thin films. The inorganic-organic thin films can be used in an electroluminescent device for hole transport, electron transport and/or emission layers.

There are many problems with using the organic-inorganic mixtures disclosed in the Tokito patent as emission layers. For example, wide bandgap insulating inorganic materials, such as metal fluorides, metal oxides and metal chalcogenides, are used in which the organic compounds are randomly dispersed. These insulating inorganic materials prevent charge conduction to the organic compounds, resulting in higher power requirements and lower intensity fluorescence. In addition, the organic compound is randomly dispersed in the inorganic compound. Hence, individual organic molecules or clusters of molecules can form in the thin film. The random orientation and clustering of the organic molecules increases the variability of fluorescence and inhibits charge transport. Charge conduction problems can be addressed by using very thin emitting layers (less than 500 Angstroms), however this requires very tedious control of layer deposition and makes devices more prone to defects such as shorts and electrical breakdown.

Furthermore, the high vacuum deposition method used in the Tokito patent to deposit the organic-inorganic thin films is very expensive for mass production.

It is an object of the present invention to provide an electroluminescent device containing an organic-inorganic emitting layer that is not random, but orients itself into a predictable arrangement. This reduces the variability of fluorescence and increases charge conduction between the inorganic and organic components. As a result lower power requirements, reduced device degradation, and greater intensity of fluorescence are achieved. Also, thicker film layers can be deposited, resulting in a device that is less prone to shorts and electrical breakdown.

It is a further object of the present invention to provide an electroluminescent device containing an organic-inorganic material that is readily deposited on a substrate by simple and inexpensive methods.

SUMMARY OF THE INVENTION

The present invention relates to an electroluminescent device comprising an anode, a cathode and an emitting layer. The emitting layer comprises a self-assembling organic-inorganic hybrid material comprising an organic component and an inorganic component. The organic component comprises a dye that fluoresces in the visible range. In addition, an optically inert component can replace a portion of the organic dye component, resulting in an organic-inorganic hybrid material that has a higher intensity fluorescence than a hybrid material that is fully loaded with the organic dye.

DETAILED DESCRIPTION OF THE INVENTION

Figure 1:
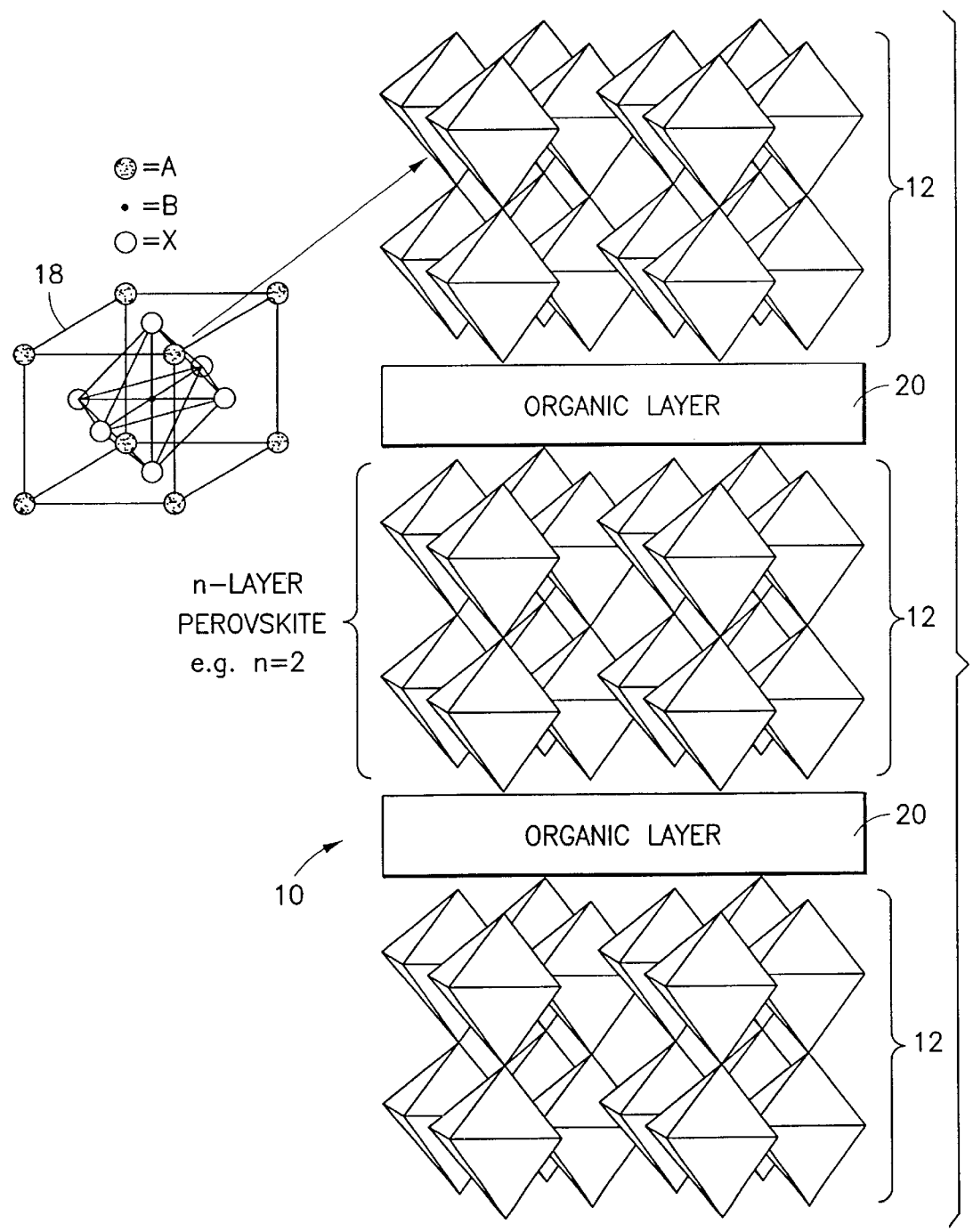
FIG. 1 illustrates one example of an organic-inorganic hybrid material that is based on a three-dimensional perovskite structure, $ABX_3$.

The present invention relates to an electroluminescent device comprising an anode, a cathode and an emitting layer. The emitting layer comprises an organic-inorganic hybrid material containing a dye that fluoresces in the visible range.

The emitting layer of the present invention combines the advantages of an inorganic crystalline material with those of an organic material. The organic component, comprising the dye, serves as an emitter center and also facilitates the self-assembly of the material to a crystalline like structure. The inorganic component forms an extended one-, two- or three-dimensional network that may be metallic, semiconducting or insulating. In addition, the inorganic component enhances the thermal stability of the molecular composite. In the case of semiconducting inorganic frameworks, the excitons associated with the inorganic networks may be transferred to the organic dye, increasing its emission, especially when the dye is tailored to absorb in the wavelength range of the exciton.

The hybrid material of the present invention solves many of the problems associated with the prior art organic-inorganic films. The inorganic component of the present invention can be made up of lower bandgap materials, which increases charge conduction and hence enables lower operating electric fields. Lower operating electric fields increase working lifetimes and reduce cost. Higher conductance also means that the organic-inorganic films of the present invention can be made thicker, thereby making devices less prone to shorts and electrical breakdowns. Alternatively, higher bandgap inorganic components can be used that may increase charge recombination by selectively blocking carriers. In addition, the present organic-inorganic films can be deposited using less costly methods, such as spin coating or single-source ablation, because of the self-assembling nature of the material.

For the purposes of this invention, an organic-inorganic hybrid material shall mean a material composed of: organic components and inorganic components which are mixed together on a molecular level, and (i) wherein the material is characterized by a substantially fixed ratio of each organic component to each inorganic component; and (ii) wherein both organic and inorganic components manifest forces that enable a self assembly therebetween into a predictable arrangement.

One example of an organic-inorganic hybrid material takes the form of an organic-inorganic perovskite structure. Layered perovskites naturally form a quantum well structure in which a two dimensional semiconductor layer of corner sharing metal halide octahedra and an organic layer are alternately stacked.

For preparation of such organic-inorganic hybrid materials, spin-coating techniques are suitable because many organic-inorganic perovskites are soluble in conventional aqueous or organic solvents. Using this method, high quality, highly oriented, layered perovskite thin films have been achieved. Vacuum evaporation techniques have also been used to grow films of layered perovskites. Copending U. S. patent applications, Ser. No. 09/192,130, now U.S. Pat. No. 6,117,498 entitled "Single-Source Thermal Ablation Method for Depositing Organic-Inorganic Hybrid Films"; and U.S. Pat. No. 5,871,579, entitled "Two-Step Dipping Technique for the Preparation of Organic-Inorganic Perovskite Thin Films", assigned to the same Assignee as this Application, both speak to alternative deposition methods for organic-inorganic hybrid materials. The disclosures of the aforementioned documents are incorporated herein by reference.

FIG. 1 illustrates one example of an organic-inorganic hybrid material 10 that is based on a three-dimensional perovskite structure, $ABX_3$. The perovskite structure comprises corner-sharing $BX_6$ octahedra 12. Each octahedron 12 is defined by six X anions at the vertices and one B cation in the center (see crystal schematic 18). The A cations sit in the large interstices between octahedra 12.

Layered inorganic compounds based on the three dimensional perovskite structure can be visualized by taking an n-layer thick "cut" (n=1 to infinity) along the <100> or <110> planes of the perovskite. In the organic-inorganic hybrid materials, the anionic, inorganic $BX_6$ octahedra of the perovskite sheets are charge balanced by cationic, organic molecules 20 forming alternating layers and/or sitting in the A cation interstitial sites. Examples of these materials include B=Group 14 (IV A), transition metal, and rare-earth elements, X=halogen (Cl, Br, or I), and A=organic ammonium or diammonium cations. In the present invention, the organic ammonium or diammonium cation will contain a dye derivative that will fluoresce in the visible range.

Inorganic perovskite sheets 12 and organic layers 20 are bound by strong, ionic and hydrogen bonding. The ionic bonding requires the organic-inorganic compound to have a specific stoichiometry and the organic molecules to sit in well-defined, crystallographic sites. The bonding between the organic and inorganic layers causes these hybrid materials to deposit as locally-ordered or crystalline, thin films or to grow as single crystals.

In many of these layered perovskite compounds, exciton formation within the inorganic component of the structure is observed with large binding energies (>300 meV) and oscillator strength. Interesting physical properties such as strong room temperature photoluminescence, third harmonic generation, and polariton absorption arise from these excitons. The strong photoluminescence and the ability to tune the wavelength by means of incorporating different metal or halogen atoms make the perovskite materials attractive as emitter materials.

Figure 2:
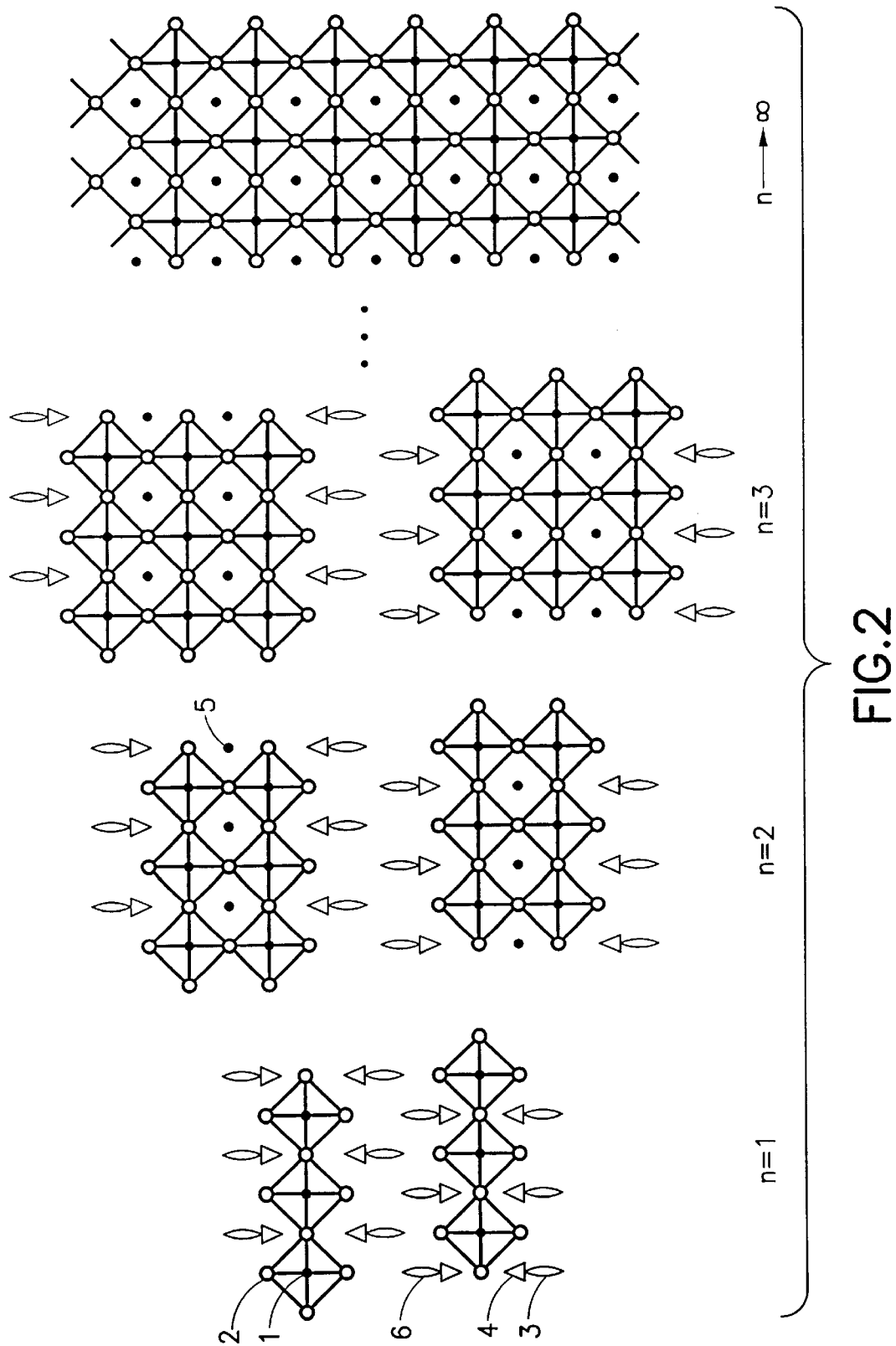
FIG. 2 illustrates a preferred perovskite structure with the general formula: $(RNH_3)_2(CH_3NH_3)_{n-1}M_n X_{3n+1}$.

A preferred perovskite material shown in FIG. 2 has the general formula: $(RNH_3)_2(CH_3NH_3)_{n-1}M_nX_{3n+1}$, wherein R is an organic group; M is a divalent metal, X is a halogen and n is one or more. Metal atom 1 is a divalent metal able to adopt an octahedral coordination. Organic component 6 is composed of two components: ammonium cation 4 and organic group 3. The ammonium cation 4 hydrogen bonds to the inorganic halogens 2, with organic group 3 extending into the space between the layers and holding the structure together via van der Waals interactions.

Figure 3:
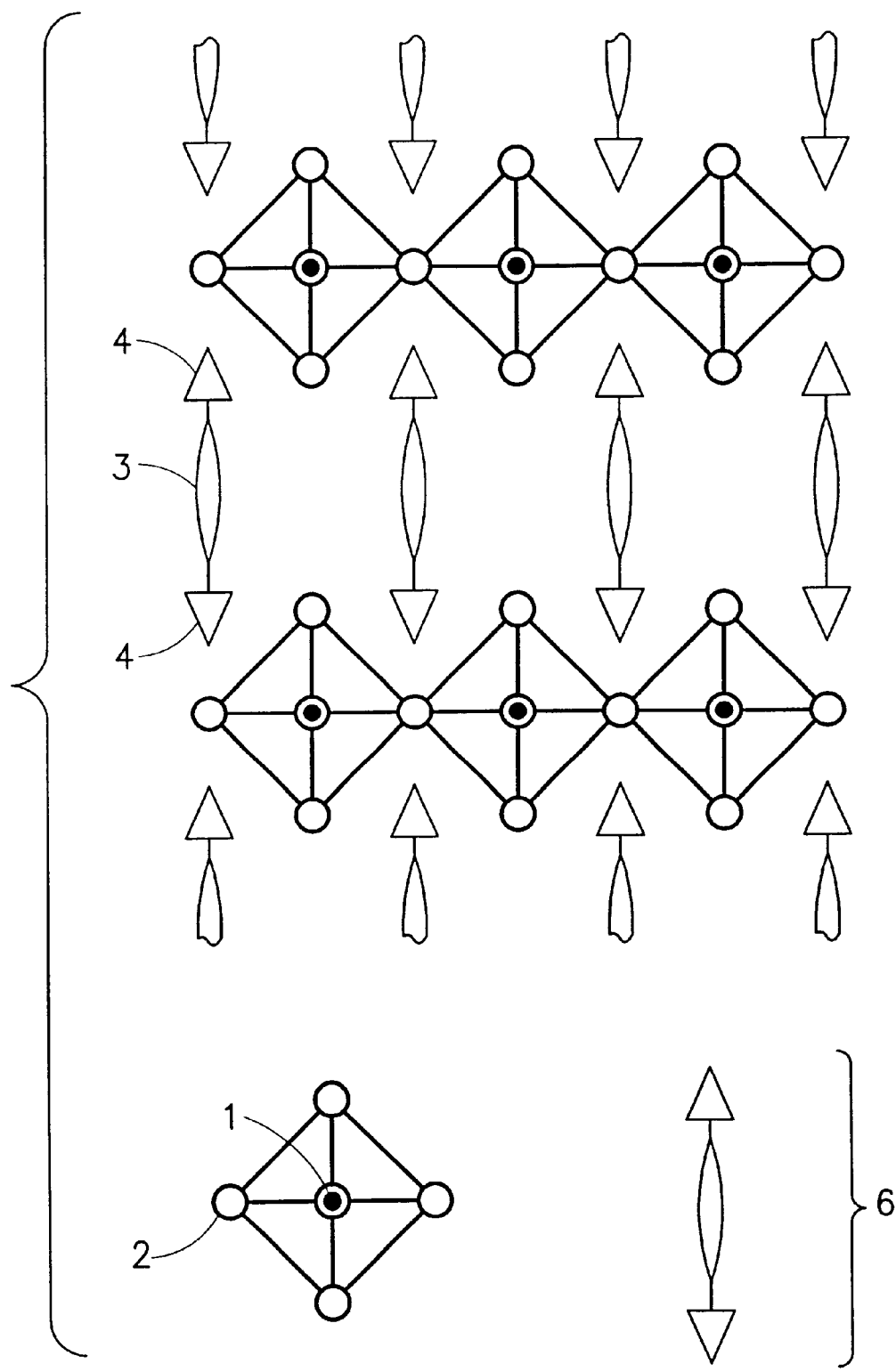
FIG. 3 illustrates a preferred perovskite structure with the general formula: $(NH_3—R—NH_3)(CH_3NH_3)_{n-1}M_nX_{3n+1}$, wherein n=1.

Another preferred. perovskite shown in FIG. 3 has the general formula $(NH_3-R-NH_3)(CH_3NH_3)_{n-1}M_nX_{3n+1}$, wherein n=1 and where R is described above. In this case, organic component 6 has two ammonium cations 4 that bond to the inorganic halogens 2.

The organic component is preferably a derivative of a dye that will fluoresce in the visible range. Examples of preferred dye derivatives are tolan, thioxanthone, coumarin, perylene, oxadiazole, polyenes, oligothiophenes, oligophenylenes, phenylene vinylenes, thiophene vinylenes and mixtures thereof. A more preferred organic dye component is 5,5'''-bis(aminoethyl)-2,2':5',2'':5'',2'''-quaterthiophene (AEQT).

Besides altering the organic component, various modifications can be made to the inorganic component. Appropriate selection of the metal and halogen atoms change the location of the exciton, which can be tuned to different areas of the optical spectrum. For example, with a perovskite of the formula $(RNH_3)_2PbX_4$, (R=alkyl), the exciton is located at 332, 405 and 504 nm when X is Cl, Br and I respectively. To obtain optimal fluorescence from the dye, the organic dye component is chosen to absorb in the energy range at which the exciton is located or at lower energy.

Likewise, a change in the inorganic sheet thickness can vary the conductance of the film. For example, for the $(C_4H_9NH_3)_2(CH_3NH_3)_{n-1}Sn_nI_{3n+1}$ perovskite family, the room temperature resistivity decreases with increasing sheet thickness, "n", yielding even a metallic character when n is higher than 3.

In another embodiment of the present invention, a portion of the organic dye component in the organic-inorganic hybrid material is replaced with an optically inert material component. An optically inert component is one that does not fluoresce or absorb in the visible range. The incorporation of the optically inert material component may actually increase fluorescence because some dyes self quench in high concentrations. The dye concentration should be less than 70 mole %, preferably less than 50 mole %, more preferably less than 20 mole %, still more preferably less than 10 mole % and even more preferably less than 5 mole % based on the total organic component in the organic-inorganic hybrid material. Any suitable optically inert material may be used as long as it will bond to the inorganic component to preserve the predicable nature of the hybrid material. A preferred optically inert material is 1,6-bis(5'-(2" aminoethyl)-2'-thienyl) hexane (AETH), phenethylamine (PEA), butyl diamine (BDA) ,or other alkyl amines. In addition, other inert molecules can be prepared by modifying dye molecules so they do not emit light. This can be accomplished, for example, by braking the conjugation (i.e. braking the sequence of alternating double (or triple) and single bonds.).

Figure 4A:
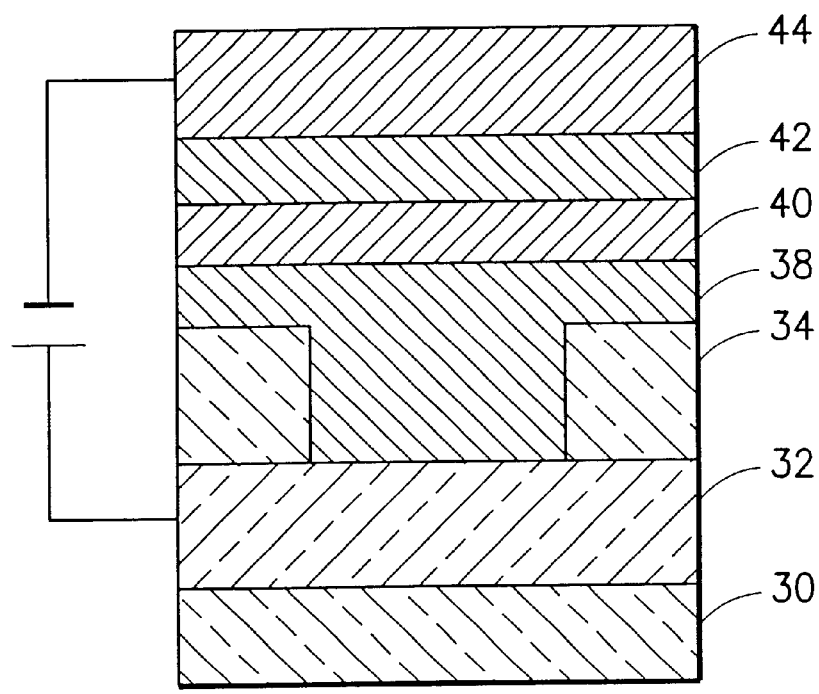
FIG. 4a is a cross-sectional view of an electroluminescent device.
Figure 4B:
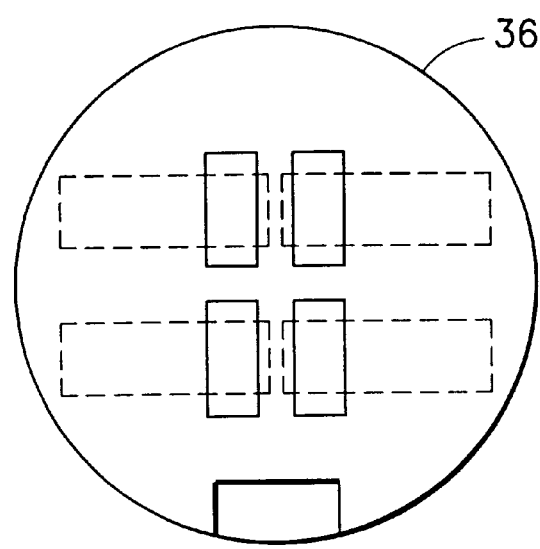
FIG. 4b is a bottom view of an electroluminescent device.

The foregoing inorganic-organic hybrid materials may be used in an electroluminescent device. A typical electroluminescent device is shown in FIG. 4. A transparent electrode 32 is deposited on an optically smooth and transparent plate 30. The thickness of the transparent anode is typically about 1000 to 2000-Angstroms and is made of any suitable transparent anode material such as indium tin oxide, indium zinc oxide, or organic materials such as polyaniline.

An insulating material 34, such as silicon dioxide, is deposited in order to define device areas 36 on top of transparent anode 32. The emitting layer 38, comprising the organic-inorganic hybrid material of the present invention is then deposited at a thickness of about 200 to 4000-Angstrom using any suitable means. The material is annealed at about 180° C. for about 10 minutes. A thin electron transport material 40 is deposited on top of the emitting layer at a thickness of about 100 to 500 Angstroms. Any suitable material can be used as an electron transport material 40 such as derivatives of oxadiazoles, triazoles, Bisbenzimidazo(2,1-a:2',1'-a')anthra(2,1,9-def:6,5,10-d'e'f') diisoquinoline-10,21-dione (PTCBI), etc. The device is completed by depositing a cathode 42 at a thickness of about 300 to 3000 Angstroms. Any suitable cathode material 42 may be used such as low work function metals (Mg, Ca, In, etc.) and mixtures thereof.

An inert conducting material 44 such as gold or silver to prevent oxidation may cap the cathode 42.

EXAMPLE 1

An electroluminescent device was prepared using a perovskite of the formula (AEQT)PbBr$_4$ as the emitting layer. The transparent anode consists of a 1500-Angstrom layer of indium tin oxide that was evaporated on top of a smooth quartz crystal substrate. A 1200-Angstrom thick silicon dioxide layer was evaporated through a contact mask to define the device area. The perovskite-emitting layer was then deposited at a thickness of 400-Angstrom using single source thermal ablation. Next, a thin electron transport layer of OXD7 (1,3-bis((4-tert-butylphenyl)-1,3,4-oxadiazolyl) phenylene) was thermally deposited at a thickness of 300-Angstrom. A low work function cathode consisting of a magnesium-silver alloy (25:1) was deposited and capped by 1200-Angstrom of pure silver.

Figure 5A:
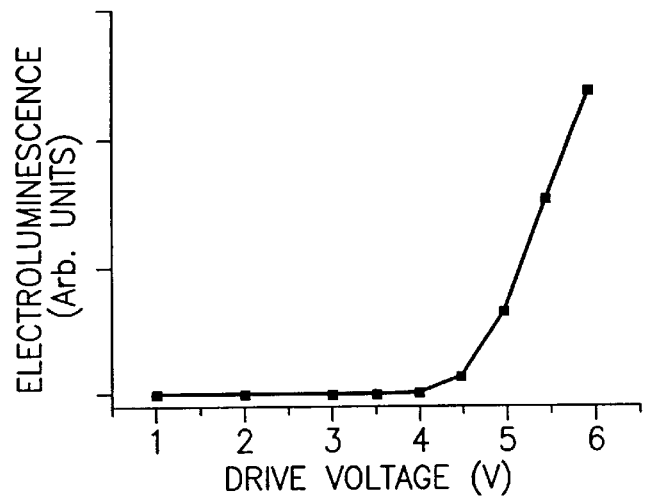
FIG. 5a is a plot of electroluminescence vs. drive voltage of a device with a perovskite emitter layer of the formula: (AEQT) $PbBr_4$.
Figure 5B:
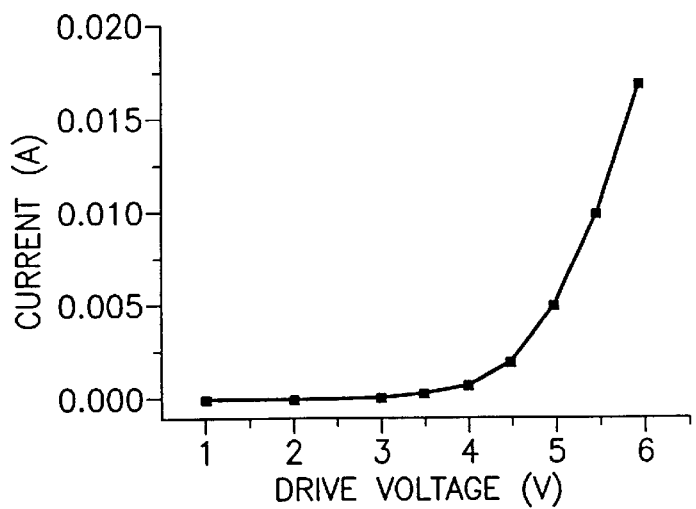
FIG. 5b is a plot of current vs. drive voltage of a device with a perovskite emitter layer of the formula: (AEQT) $PbBr_4$.
Figure 5C:
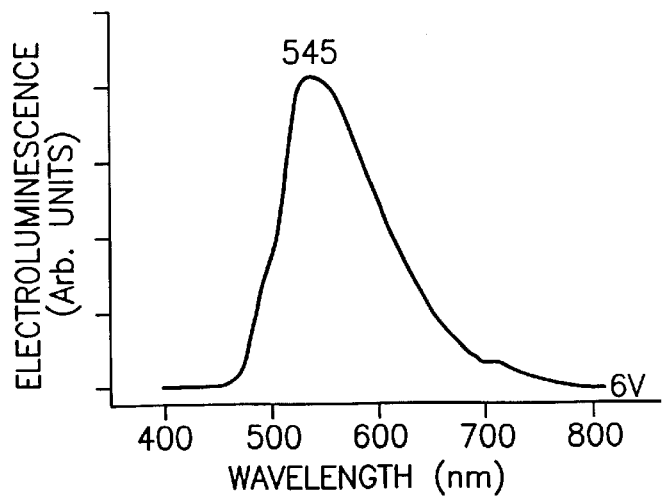
FIG. 5c is an electroluminescence spectrum of a device with a perovskite emitter layer of the formula: (AEQT) $PbBr_4$.

When a voltage was applied to the device, green fluorescence was observed under normal lighting conditions and at room temperature. Characterization data for this device is shown in FIG. 5. Although this device was not optimized, it exhibited very low driving voltages (less than 5 V). The spectrum 5c is very similar to the photoluminescence spectrum exhibited by an organic salt with the formula (AEQT) .HBr indicating that the light emission arises from the organic component and essentially no emission occurs from the inorganic component.

In addition, an 800-Angstrom thick emitter device was prepared using the above procedure. It operated very similarly to the 400-Angstrom emitter device, with only a slight increase of about 1 V in the operating voltage. This indicates good charge conduction even though the thickness of the emitter layer was doubled.

The successful operation of the device at room temperature demonstrates the principal of obtaining light emission from the organic component of the organic-inorganic hybrid material.

EXAMPLE 2

Figure 6:
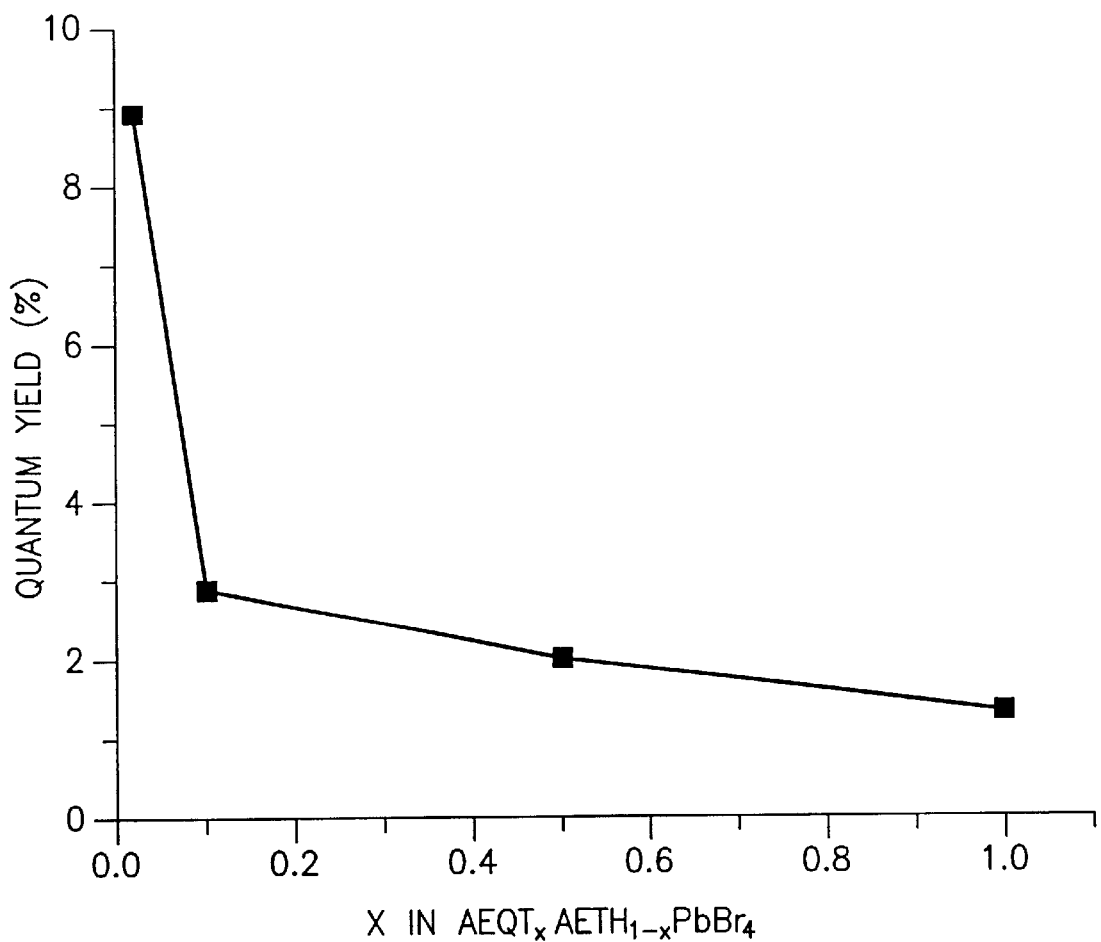
FIG. 6 is a plot of photoluminescence quantum yield vs. dye concentration for a material with the formula $AEQT_xAETH_{1-x}PbBr_4$.

To examine the approach of replacing a portion of the dye component with an optically inert material, films with different ratio of the two components were prepared by thermal ablation. The organic dye component was AEQT and the optically inert material was AETH or bis(5'-(2"-aminoethyl)-2'-thienyl)hexane. The film material had the general formula AEQT$_x$AETH$_{1-x}$PbBr$_4$. Measurement of the photoluminescnce quantum yield vs. dye concentration is shown in FIG. 6. The data reveals that there is an increase in quantum yield as the amount of dye relative to the inert material is decreased. The highest yield measured was when the concentration of the dye was approximately 2 mole %. Incorporation of such dye-doped hybrids in the OLED is expected to increase the efficiency of the device.

It should be noted that the foregoing description is only illustrative of the invention. Various alternatives and modifications can be devised by those skilled in the art without departing from the present invention.

What is claimed is:

1. An electroluminescent device comprising: an anode, a cathode and an emitting layer, wherein said emitting layer is disposed between said anode and said cathode and comprises a self-assembling organic-inorganic perovskite material comprising an organic component and an inorganic component, wherein said organic component comprises a dye component selected from the group consisting of derivatives of tolan, thioxanthone, coumarin, perylene, oxadiazole, polyenes, oligophenylenes, phenylene vinylenes, thiophene vinylenes, 5,5'''-bis(aminoethyl)-2,2':5',2":5",2'''-quaterthiophene (AEQT) and mixtures thereof.

2. The device of claim 1, wherein said organic-inorganic perovskite material has an inorganic component consisting of a metal halide.

3. The device of claim 1 wherein said dye component fluoresces in the visible range.

4. The device of claim 3 wherein said dye component is 5,5'''-bis(aminoethyl)-2,2':5',2":5",2'''-quaterthiophene (AEQT).

5. The device of claim 1 wherein said perovskite has the general formula: $(RNH_3)_2(CH_3NH_3)_{n-1}M_nX_{3n+1}$, wherein R is an organic group; M is a divalent metal, X is a halogen and n is from one to six.

6. The device of claim 1 wherein said perovskite has the general formula: $(NH_3-R-NH_3)(CH_3NH_3)_{n-1}M_nX_{3n+1}$, wherein R is an organic group, M is a divalent metal, X is a halogen and n is from one to six.

7. An electroluminescent device comprising:

an anode, a cathode and an emitting layer, wherein said emitting layer is disposed between said anode and said cathode and comprises a self-assembling organic-inorganic perovskite material comprising an organic component and an inorganic component, wherein said organic component comprises a dye component selected from the group consisting of derivatives of tolan, thioxanthone, coumarin, perylene, oxadiazole, polyenes, oligophenylenes, phenylene vinylenes, thiophene vinylenes, 5,5'''-bis(aminoethyl)-2,2':5', 2":5",2'''-quaterthiophene (AEQT) and mixtures thereof and an optically inert component.

8. The device of claim 7, wherein said organic-inorganic perovskite material has an inorganic component consisting of a metal halide.

9. The device of claim 7 wherein said dye component fluoresces in the visible range.

10. The device of claim 9 wherein said dye component is 5,5'''-bis(aminoethyl)-2,2':5',2":5",2'''-quaterthiophene (AEQT).

11. The device of claim 7 wherein said perovskite has the general formula: $(RNH_3)_2(CH_3NH_3)_{n-1}M_nX_{3n+1}$, wherein R is an organic group, M is a divalent metal, X is a halogen and n is from one to six.

12. The device of claim 7 wherein said perovskite has the general formula: $(NH_3-R-NH_3)(CH_3NH_3)_{n-1}M_nX_{3n+1}$, wherein R is an organic group, M is a divalent metal, X is a halogen and n is from one to six.

13. The device of claim 7 wherein said dye component is greater than 0 and less than 10% of the total organic component.

14. The device of claim 7 wherein said dye component is greater than 0 and less than 5% of the total organic component.

15. The device of claim 7, wherein said inert component is selected from the group consisting of 1,6-bis(5'-(2"aminoethyl)-2'-thienyl) hexane (AETH), phenethylamine (PEA), butyl diamine (BDA), alkyl amines, and modified (non-conjugated) dye molecules derivatives of tolan, thioxanthone, coumarin, perylene, oxadiazole, polyenes, oligophenylenes, phenylene vinylenes, and thiophene vinylenes.

16. An electroluminescent device comprising:

an anode, a cathode and an emitting layer, wherein said emitting layer is disposed between said anode and said cathode and comprises a self-assembling organic-inorganic hybrid material comprising an organic component and an inorganic component, wherein said organic component comprises a dye component, wherein said dye component is 5,5'''-bis(aminoethyl)-2,2':5',2":5",2'''-quaterthiophene (AEQT).

17. An electroluminescent device comprising:

an anode, a cathode and an emitting layer, wherein said emitting layer is disposed between said anode and said cathode and comprises a self-assembling organic-inorganic hybrid material comprising an organic component and an inorganic component, wherein said organic component comprises a dye component and an optically inert component, wherein said dye component is 5,5'''-bis(aminoethyl)-2,2':5',2":5",2'''-quaterthiophene (AEQT).

* * * * *